EMITTER-FOLLOWER AND CATHODE-FOLLOWER AMPLIFIERS

Filed Jan. 23, 1968 2 Sheets-Sheet 1

INVENTOR
H. SEIDEL
BY
Sylvan Sherman
ATTORNEY

Oct. 13, 1970 H. SEIDEL 3,534,283
EMITTER-FOLLOWER AND CATHODE-FOLLOWER AMPLIFIERS
Filed Jan. 23, 1968 2 Sheets-Sheet 2

3,534,283
EMITTER-FOLLOWER AND CATHODE-FOLLOWER AMPLIFIERS

Harold Seidel, Warren Township, Somerset County, N.J., assignor to Bell Telephone Laboratories, Incorporated, Murray Hill, N.J., a corporation of New York Filed Jan. 23, 1968, Ser. No. 699,937
Int. Cl. H03f 1/22, 3/50
U.S. Cl. 330—157 4 Claims

ABSTRACT OF THE DISCLOSURE

The invention solves the problem of cascading emitter- (and cathode-) follower amplifiers by coupling into and out of successive emitter-followers by means of matched networks. Each complete stage comprises an input 3 db quadrature hybrid and an output 3 db quadrature hybrid interconnected by means of two emitter-follower amplifiers. It is shown that such an arrangement can be cascaded to produce, ideally, 6 db power gain per stage, and that the resulting cascade is unconditionally stable over the band of frequencies for which the hybrids are designed to operate.

This invention relates to arrangements for cascading unity gain amplifiers such as emitter-followers and cathode-followers.

BACKGROUND OF THE INVENTION

The ability to deliver a large amount of power over an extended range of frequencies requires an active element that is capable both of handling the level of power required and of satisfying the circuit demands for proper frequency behavior. Unfortunately high power transistors always exhibit large internal capacitances and are, therefore, limited in bandwidth. Within limits, this problem can be resolved by using an emitter-follower circuit configuration since the large self-degeneration in an emitter-follower amplifier makes its response fairly impervious to internal parameter variations. In practice, however, the emitter follower is used only as a buffer device for transforming, with substantially unity voltage gain, between a high impedance source and a low impedance load.

While it is well recognized that power gain exists, the emitter-follower does not produce voltage gain. Hence, additional power gain cannot be realized by directly cascading stages. Further power gain can only be realized by the inclusion of some suitable means, such as a transformer, between stages for producing the necessary voltage gain. In most instances, however, the use of transformers has been viewed as too complex to be practical. Furthermore, such an arrangement can only be used at low frequencies where the input impedance of the transistor is relatively high and reasonably constant with frequency, and where reflections are not a serious consideration. At higher frequencies, however, the use of transformers as a means of cascading emitter-followers to produce broadband power gain is completely unsatisfactory.

SUMMARY OF THE INVENTION

In accordance with the invention, transformerless, stable, broadband, high power gain amplifiers, using cascaded emitter-follower stages, can be realized by coupling into and out of each emitter-follower by means of matching networks. In the illustrative embodiment of the invention to be described in greater detail hereinbelow, each emitter-follower stage comprises an input 3 db quadrature hybrid junction and an output 3 db quadrature hybrid junction interconnected by means of two unity gain amplifiers such as, for example, emitter-followers. Each amplifier couples one branch of one pair of conjugate branches of the input hybrid to a branch of one pair of conjugate branches of the output hybrid. A third branch of each hybrid constitutes, respectively, the input and output ports of the stage, while the fourth branch of each hybrid is connected to a resistor which match-terminates the hybrid junction.

It is shown that quadrature hybrid-coupled stages of the type described can be cascaded to produce ideally a twofold voltage gain and 6 db of power gain per stage, and that the resulting cascade is unconditionally stable over the band of frequencies for which the hybrids are designed to operate.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
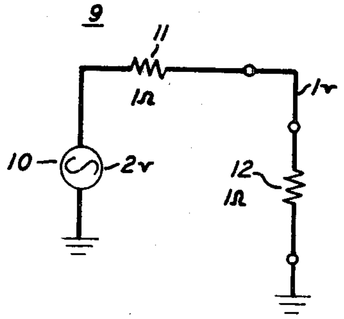
FIG. 1, included for purposes of explanation, shows a signal generator connected to a matching load.

Referring to the drawings, FIG. 1, included for purposes of explanation, shows a signal source 9, represented by a 2 volt Thevenin generator 10 and a 1 ohm resistor 11, connected to a 1 ohm matched load 12. Resistor 11 represents the normalized internal impedance of signal source 9. Resistor 12 is a normalized matched load. As is evident, the voltage across load 12 is 1 volt and the power delivered to the load is one watt.

Figure 2:
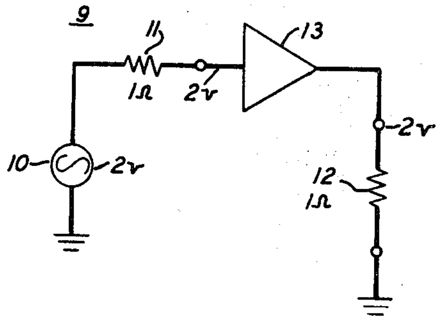
FIG. 2, included for purposes of explanation, shows a signal generator connected to a matching load through a unity voltage gain amplifier.

If, as shown in FIG. 2, a unity gain amplifier 13, such as an emitter-follower, is included between source 9 and load 12, the situation is significantly altered. Since the input impedance of emitter-follower 13 is much larger than the internal impedance of source 9, essentially all of the 2 volts available from generator 10 is impressed upon the emitter-follower, producing essentially 2 volts across load 12. The power delivered to load 12 is, therefore, 4 watts, or 6 db greater than the power delivered to load 12 without the emitter-follower.

Figure 3:
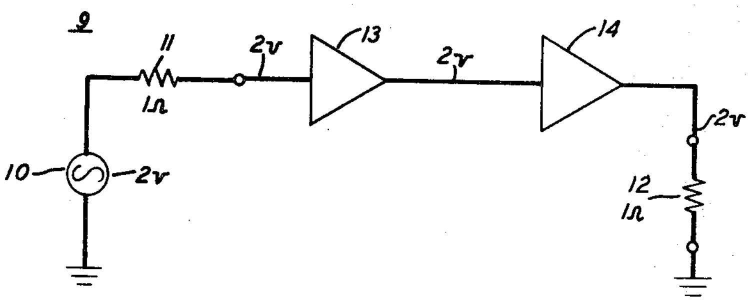
FIG. 3, included for purposes of explanation, shows a signal source connected to a matching load through two cascaded unity gain amplifiers.

At first blush it would appear reasonable to add a second emitter-follower, as in FIG. 3, in an effort to obtain an additional 6 db of power gain. However, it becomes readily apparent that no additional gain can be realized in this manner. Referring to FIG. 3, the 2 volts impressed upon the first emitter-follower 13 produces no more than 2 volts at the input of the second emitter-follower 14 and, hence, no more than 2 volts at the load. Thus, in the absence of voltage gain, the power delivered to the load is again 4 watts, or the same as was obtained using only one emitter-follower amplifier.

Figure 4:
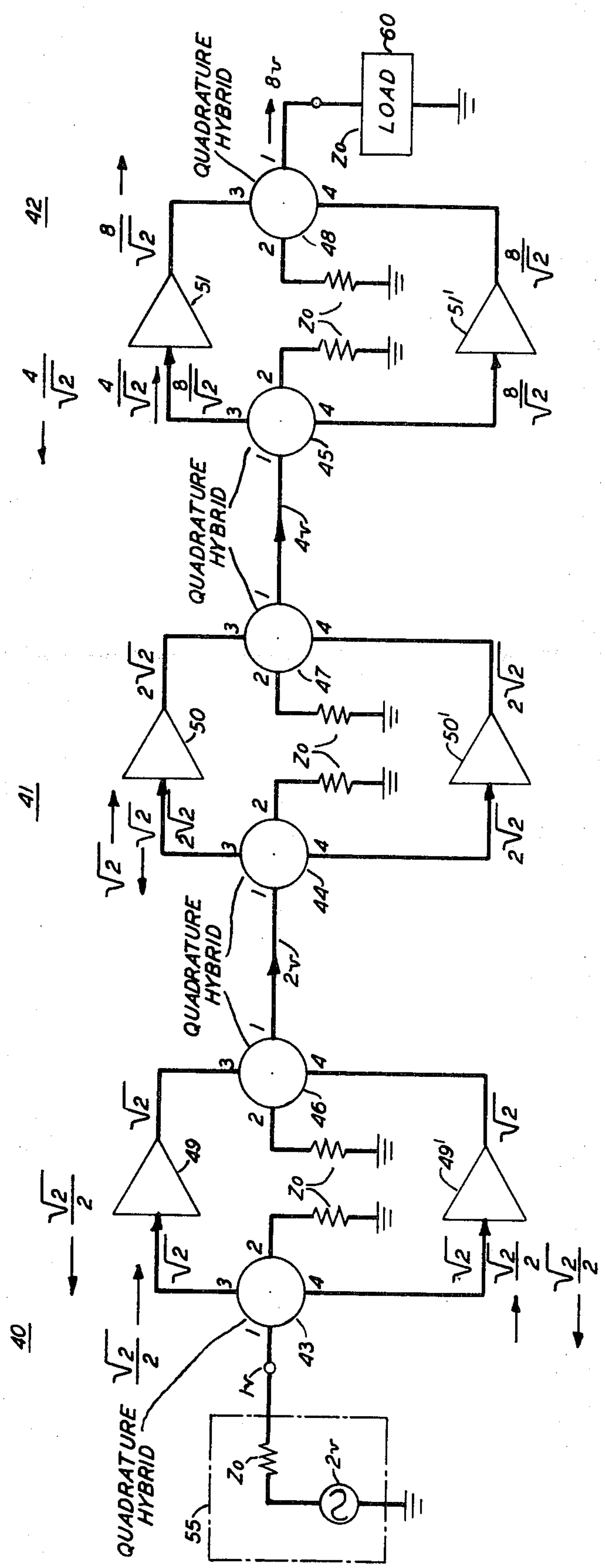
FIG. 4 shows three cascaded, unity gain amplifier stages, in accordance with the invention.

At low frequencies, where the input impedance of an emitter-follower is orders of magnitude higher than its output impedance, and where reflections due to impedance discontinuities are relatively unimportant, voltage gain can be realized in a cascaded configuration by the addition of a step-up transformer between stages. This, however, is not a practical solution at higher frequencies since, at the higher frequencies, the impedance levels are not as indicated above, nor can reflections be neglected. What is required is an arrangement which restores a match from stage to stage since it is precisely through the interface of a matched source and an open circuit that 6 db gain was achieved in the single stage emitter-follower circuit of FIG. 2. An arrangement which provides this match is shown in FIG. 4. More specifically FIG. 4 shows a three stage emitter-follower circuit comprising three cascaded matched stages 40, 41 and 42.

In accordance with the present invention each of the stages 40, 41 and 42 comprises an input 3 db quadrature hybrid 43, 44 or 45, an output 3 db quadrature hybrid 46, 47 or 48, and a pair of emitter-followers 49–49′, 50–50′ or 51–51′ connected therebetween. Each of the input and output hybrids have four branches 1, 2, 3 and 4, arranged in pairs, with the branches of each pair, 1–2 and 3–4, being conjugate to each other and in coupling relationship with the branches of the other of said pairs. Being 3 db hybrids, power introduced at one branch of a pair of said branches is divided equally between the branches of the second pair. In addition, the signal components in the second pair of branches are 90 degrees out of time phase, hence the designation "quadrature" hybrid. Examples of such hybrids are the Riblet coupler (H. J. Riblet "The Short-Slot Hybrid Junction," Proceedings of the Institute of Radio Engineers, February 1952, pages 180–184), the multihole directional coupler (S. E. Miller, "Coupled Wave Theory and Waveguide Applications," Bell System Technical Journal, May 1954, pages 661–719), the semi-optical directional coupler (E. A. J. Marcatili, "A Circular Electric Hybrid Junction and Some Channel-Dropping Filters," Bell System Technical Journal, Janary 1961, pages 185–196), the strip transmission line directional coupler (T. K. Shimizu "Strip-Line 3 db Directional Coupler," 1957 Institute of Radio Engineers, Wescon Convention Record, vol. 1, Part 1, pages 4–15), and the lumped-element quadrature hybrids sold by Merrimac Research and Development, Incorporated, as advertised, for example, in the September 1966 issue of Microwave Journal.

As illustrated in FIG. 4, branch 1 of each of the hybrids 43, 44 and 45 is the stage input. Branch 1 of each of the hybrids 46, 47 and 48 is the stage output port. Conjugate branch 2 of each hybrid is match-terminated by means of a resistor whose impedance $Z_0$ is equal to the characteristic impedance of the hybrids. The remaining pair of conjugate branches 3 and 4 of each input hybrid 43, 44 and 45 is connected to branches 3 and 4 of the respective output hybrids 46, 47 and 48 by means of emitter-follower pairs 49–49′, 50–50′ and 51–51′.

In operation, an input signal, derived from a matched signal source 55, is applied to branch 1 of hybrid 43. Source 55 is represented by a 2 volt Thevenin generator and an internal series resistor $Z_0$. Since the first stage 40 represents a matched load to signal source 55, the voltage applied to branch 1 of hybrid 43 is equal to one-half the open-circuit source voltage, or one volt. Since hybrid 43 divides the applied power equally between branches 3 and 4, the voltage at each of the two branches 3 and 4, due to the incident signal, is equal to $$\frac{\sqrt{2}}{2}$$

However, as the input impedance of each of the emitter-followers 49 and 49′ is very large compared to the characteristic impedance of hybrid 43, and the transmission lines connecting the hybrid to the emitter-followers, the incident signal is totally reflected in phase at each emitter-follower. The resulting voltage at the input of each emitter follower is thereby double, or equal to $\sqrt{2}$.

The reflected signals combine in branch 2 of hybrid 43, and are dissipated in the terminating resistor $Z_0$. The output signals from the two emitter-followers, which are approximately equal in amplitude to the input signals, i.e. $\sqrt{2}$ volts, combine in branch 1 of the stage output hybrid 46 to produce an output signal from the first stage equal to 2 volts.

This process is repeated in each stage to produce a 4 volt output signal from stage 41 and an 8 volt output signal source to a matching load through a unity voltage the cascade, the 8 volt signal is coupled to a matched output load 60.

It will be noted that each stage is matched at both its input and output ends. Hence, each stage couples the signal source to a matching load through a unity voltage gain amplifier, as in FIG. 2. In addition, because of the match there are no reflection problems associated with the cascade of emitter-followers in accordance with the invention and, hence, the circuit is unconditionally stable over the operating frequency range of the hybrids. This is in contrast to the situation that would obtain simply by inserting transformers, between emitter-follower stages, as suggested in connection with FIG. 3. Notwithstanding the absence of transformers, however, there is nevertheless, ideally, a twofold voltage gain associated with each of the stages 40, 41 and 42 and a corresponding 6 db power gain per stage.

As indicated above, the showing of three stages in FIG. 4 is merely illustrative. Additionally, stages can be cascaded to produce, more generally, a total voltage gain of $2^n$ and a total power gain of $2^{2n}$, where $n$ is the total number of cascaded stages.

Figure 5:
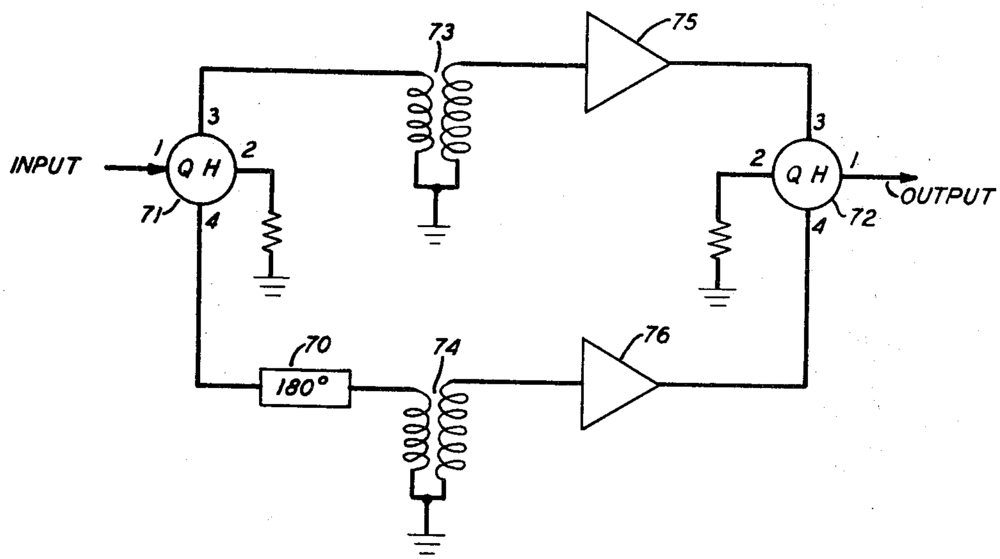
FIG. 5 shows a modified unity gain amplifier stage in accordance with the invention.

Each of the stages 40, 41 and 42 represents the basic emitter-follower stage in accordance with the invention. Various modifications of the basic stage can be made, as illustrated in FIG. 5, to meet a variety of practical limitations. For example, it is known that the power division ratio of a quadrature hybrid is frequency sensitive. Accordingly, as explained in United States Pat. 3,184,691, the overall frequency response of each stage can be extended by the inclusion of a broadband 180 degree relative phase shifter 70 in one of the wavepaths connecting input hybrid 71 and output hybrid 72. It will also be appreciated that the voltage gain through an emitter-follower is generally less than unity. In those situations where somewhat greater gain is desired, step-up transformers 73 and 74 can also be included in each of the wavepaths connecting hybrid 71 to hybrid 72. The use of a transformer in this manner is to be distinguished, however, from the type of transformer use suggested in connection with FIG. 3. In the latter instance, the transformer was intended to overcome the inherent inability of even an ideal emitter-follower to produce voltage gain. In the instant case, the stage inherently produces voltage gain. The transformers are included merely to make up for any deviation from the ideal gain.

The use of a transformer to increase the stage gain is limited, however, in that it tends to reduce the input impedance of the emitter-follower amplifier. To the extent that the reduced impedance remains high compared to the characteristic impedance of the hybrids, operation is unimpaired. If, however, the reduced impedance becomes comparable to that of the hybrid characteristic impedance, the voltage at the emitter-follower will be correspondingly reduced. A related limitation on the output impedance of the emitter-follower amplifier is applicable if the transformer is, alternatively, located on the output side of the emitter-follower amplifiers 75 and 76. In this case, however, the stage gain is reduced as the emitter-follower output impedance is increased from its usual low value by the square of the transformer turns ratio and becomes comparable to the hybrid impedance.

As noted above, a cascade of emitter-followers in accordance with the invention, is unconditionally stable over the operating frequency range of the hybrids. The problem of stability beyond the hybrid bandwidth can be resolved, where necessary, by the occasional inclusion of a constant-impedance channel dropping filter between groups of stages.

While reference was made to emitter-followers, it is understood that the invention is equally applicable to cathode-followers or, more generally, to any type of unity gain ampifier. Thus, in all cases it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. An amplifier comprising:
a plurality of cascaded stages wherein each stage includes:
an input 3 db quadrature hybrid having two pair of conjugate branches;
an output 3 db quadrature hybrid having two pair of conjugate branches;
means including a unity voltage gain amplifier for coupling each branch of one pair of conjugate branches of said input hybrid to a branch of one pair of conjugate branches of said output hybrid;
means for match-terminating one branch of the second pair of conjugate branches of each of said hybrids;
the other branch of said second pair of conjugate branches of said input hybrid being the input port of said stage;
and the other branch of said second pair of branches of said output hybrid being the output port of said stage.

2. The amplifier according to claim 1 wherein said unity gain amplifier is an emitter-follower.

3. The amplifier according to claim 1 wherein said unity gain amplifier is a cathode-follower.

4. The amplifier according to claim 1 wherein said means for coupling each branch of said one pair of conjugate branches includes a step-up transformer for increasing the gain of each of said stages.

References Cited

UNITED STATES PATENTS

| | | | |
|---|---|---|---|
| 2,847,517 | 8/1958 | Small | 330—124 X |
| 3,060,390 | 10/1962 | Brewer | 330—124 X |
| 3,202,927 | 8/1965 | Ishimoto et al. | 330—124 X |
| 3,403,357 | 9/1968 | Rosen et al. | 330—124 X |

NATHAN KAUFMAN, Primary Examiner

U.S. Cl. X.R.

330—16, 124